(12) United States Patent
Oshio

(10) Patent No.: US 9,811,055 B2
(45) Date of Patent: Nov. 7, 2017

(54) TIMEPIECE

(71) Applicant: SEIKO EPSON CORPORATION, Tokyo (JP)

(72) Inventor: Takumi Oshio, Guangdong (CN)

(73) Assignee: Seiko Epson Corporation, Tokyo (JP)

( * ) Notice: Subject to any disclaimer, the term of this patent is extended or adjusted under 35 U.S.C. 154(b) by 117 days.

(21) Appl. No.: 13/767,504

(22) Filed: Feb. 14, 2013

(65) Prior Publication Data

US 2013/0258821 A1   Oct. 3, 2013

(30) Foreign Application Priority Data

Mar. 28, 2012  (JP) ................. 2012-073043

(51) Int. Cl.

| G04B 1/00 | (2006.01) |
|---|---|
| G04C 3/00 | (2006.01) |
| G04B 25/00 | (2006.01) |
| G04C 17/00 | (2006.01) |
| G04B 19/00 | (2006.01) |
| G04B 19/04 | (2006.01) |
| G04B 19/06 | (2006.01) |
| H01L 31/042 | (2014.01) |
| H02N 6/00 | (2006.01) |
| H01L 31/00 | (2006.01) |
| G04C 10/02 | (2006.01) |
| G04B 19/10 | (2006.01) |
| G04B 19/08 | (2006.01) |
| H01L 31/0236 | (2006.01) |

(Continued)

(52) U.S. Cl.
CPC ............. *G04C 10/02* (2013.01); *G04B 19/08* (2013.01); *G04B 19/10* (2013.01); *G04G 17/045* (2013.01); *H01L 31/0236* (2013.01); *H01L 31/042* (2013.01); *H01L 31/048* (2013.01)

(58) Field of Classification Search
CPC ........ G04B 19/00; G04B 19/10; G04B 19/12; G04C 10/02
USPC ......... 368/205, 239–242; 136/244, 246, 251, 136/259
See application file for complete search history.

(56) References Cited

U.S. PATENT DOCUMENTS 5,750,241 A * 5/1998 Kobayashi et al. .......... 428/199
6,466,522 B1 * 10/2002 Yoshioka et al. ............. 368/223
(Continued)

FOREIGN PATENT DOCUMENTS

| JP | 58-016583 U1 | 2/1983 |
|---|---|---|
| JP | 2000-075108 A | 3/2000 |

(Continued)

OTHER PUBLICATIONS

The Extended European Search Report for the corresponding European Application No. 12184817.0 dated Jan. 5, 2017.

*Primary Examiner* — Amy Cohen Johnson
*Assistant Examiner* — Daniel Wicklund
(74) *Attorney, Agent, or Firm* — Global IP Counselors, LLP

(57) ABSTRACT

A timepiece includes a dial plate, and a solar battery which is disposed on a rear side of the dial plate. The dial plate is provided with grooves or ridges. The grooves or the ridges have portions where inclination angles with regard to a normal line of the dial plate are different, and due to this, light which is transmitted through the dial plate is incident from a plurality of directions with angles which are different with regard to the solar battery.

7 Claims, 4 Drawing Sheets

(51) Int. Cl.
    *H01L 31/048*     (2014.01)
    *G04G 17/04*     (2006.01)

(56) References Cited

U.S. PATENT DOCUMENTS

| | | | |
|---|---|---|---|
| 7,242,641 B2* | 7/2007 | Sato et al. | 368/205 |
| 2008/0159083 A1* | 7/2008 | Kawakami | 368/232 |
| 2009/0129210 A1* | 5/2009 | Yamaguchi et al. | 368/205 |
| 2010/0180946 A1* | 7/2010 | Gruhlke et al. | 136/259 |
| 2012/0155225 A1* | 6/2012 | Takasawa et al. | 368/223 |
| 2013/0044573 A1* | 2/2013 | Takasawa | 368/232 |
| 2013/0319505 A1* | 12/2013 | Yang et al. | 136/246 |

FOREIGN PATENT DOCUMENTS

| | | |
|---|---|---|
| JP | 2001-264459 A | 9/2001 |
| JP | 2005-069842 A | 3/2005 |
| JP | 2008-076258 A | 4/2008 |
| JP | 2009-258246 A | 11/2009 |
| JP | 2011-169806 A | 9/2011 |
| WO | WO 03060613 A1 * | 7/2003 |

* cited by examiner

TIMEPIECE

CROSS-REFERENCE TO RELATED APPLICATIONS

This application claims priority to Japanese Patent Application No. 2012-073043 filed on Mar. 28, 2012. The entire disclosure of Japanese Patent Application No. 2012-073043 is hereby incorporated herein by reference.

BACKGROUND

Technical Field

The present invention relates to a timepiece.

Background Technology

Since the periodic replacement of a battery is not necessary, solar timepieces which are provided with a solar battery are widely used. In solar timepieces, normally, the solar battery is arranged on the rear surface side of a dial plate with the object of preventing or suppressing the adverse effects of the solar battery on the aesthetics of the timepiece as a whole (for example, refer to Patent Document 1). However, in solar timepieces in the related art, there have been cases where it is not possible to secure a sufficient amount of power generation even when used in a comparatively bright environment.

Japanese Laid-open Patent Application No. 2001-264459 (Patent Document 1, refer to FIG. 1 and the like) is an example of the related art.

SUMMARY

Problems to be Solved by the Invention

An advantage of the invention is to provide a timepiece with an excellent aesthetic appearance where it is possible to efficiently utilize light which is incident on a dial plate for power generation using a solar battery.

Means Used to Solve the Above-Mentioned Problems

This advantage is achieved by the invention described below.

The timepiece of the invention has a dial plate, and a solar battery which is disposed on a rear surface side of the dial plate, in which the dial plate is provided with grooves or ridges, and the grooves or the ridges have portions where inclination angles with regard to a normal line of the dial plate are different, and due to this, light which is transmitted through the dial plate is incident from a plurality of directions with angles which are different with regard to the solar battery. Due to this, it is possible to provide a timepiece with an excellent aesthetic appearance where it is possible to efficiently utilize light which is incident on the dial plate for power generation using the solar battery.

In the timepiece of the invention, the dial plate preferably has grooves or ridges which are provided concentrically as the grooves or the ridges. Due to this, a particularly excellent aesthetic appearance of the timepiece is possible while the utilization efficiency of the light is sufficiently excellent. In the timepiece of the invention, the dial plate preferably has grooves or ridges which are provided in a spiral shape as the grooves or the ridges. Due to this, by processing using an NC engraving machine or the like, it is possible to easily and reliably manufacture a dial plate which has grooves and ridges with a desired shape.

In the timepiece of the invention, the dial plate preferably has grooves or ridges, where a cross sectional shape in a direction which is orthogonal to a longitudinal direction is a curved portion, as the grooves or the ridges. Due to this, a particularly excellent aesthetic appearance of the timepiece is possible while the utilization efficiency of the light is sufficiently excellent. In the timepiece of the invention, the dial plate preferably has the grooves or ridges, where a cross sectional shape in a direction which is orthogonal to a longitudinal direction is a V shape, as the grooves or the ridges. Due to this, by processing using an NC engraving machine or the like, it is possible to easily and reliably manufacture a dial plate which has grooves and ridges with a desired shape.

In the timepiece of the invention, the dial plate preferably has the grooves or the ridges on a surface on an opposite side to a surface on a side which opposes the solar battery. Due to this, a particularly excellent aesthetic appearance (for example, the stereoscopic effect or the like of the dial plate) of the timepiece is possible while the utilization efficiency of the light is sufficiently excellent. In the timepiece of the invention, the dial plate preferably has the grooves or the ridges on a surface on a side which opposes the solar battery. Due to this, it is possible to more appropriately arrange the indicating members such as the time characters on the dial plate, and it is possible for the durability (adhesion of the indicating members) or the like of the timepiece to be particularly excellent. In the timepiece of the invention, the dial plate is preferably provided with a substrate where the grooves or ridges are provided, and a color film. Due to this, a particularly excellent aesthetic appearance (for example, the stereoscopic effect or the like of the dial plate) of the timepiece is possible.

Effect of the Invention

According to the invention, it is possible to provide a timepiece with an excellent aesthetic appearance where it is possible to efficiently utilize light which is incident on a dial plate for power generation using a solar battery.

BRIEF DESCRIPTION OF THE DRAWINGS

Referring now to the attached drawings which form a part of this original disclosure.

DETAILED DESCRIPTION OF EXEMPLARY EMBODIMENTS

Below, an appropriate embodiment of the invention will be described with reference to the attached diagrams.

First Embodiment

Figure 1:
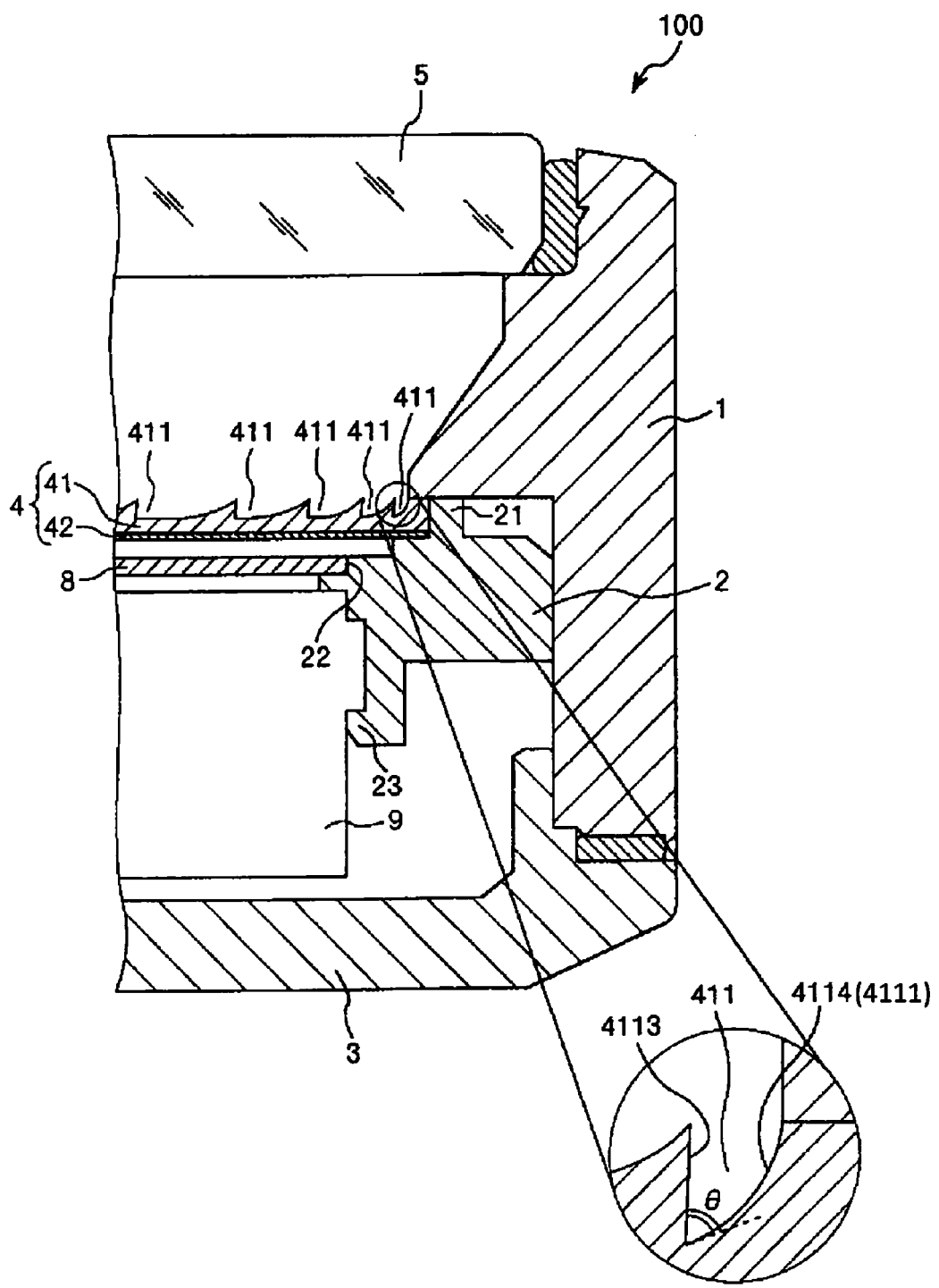
FIG. 1 is a partial cross sectional diagram illustrating a first embodiment of a timepiece of the invention.
Figure 2:
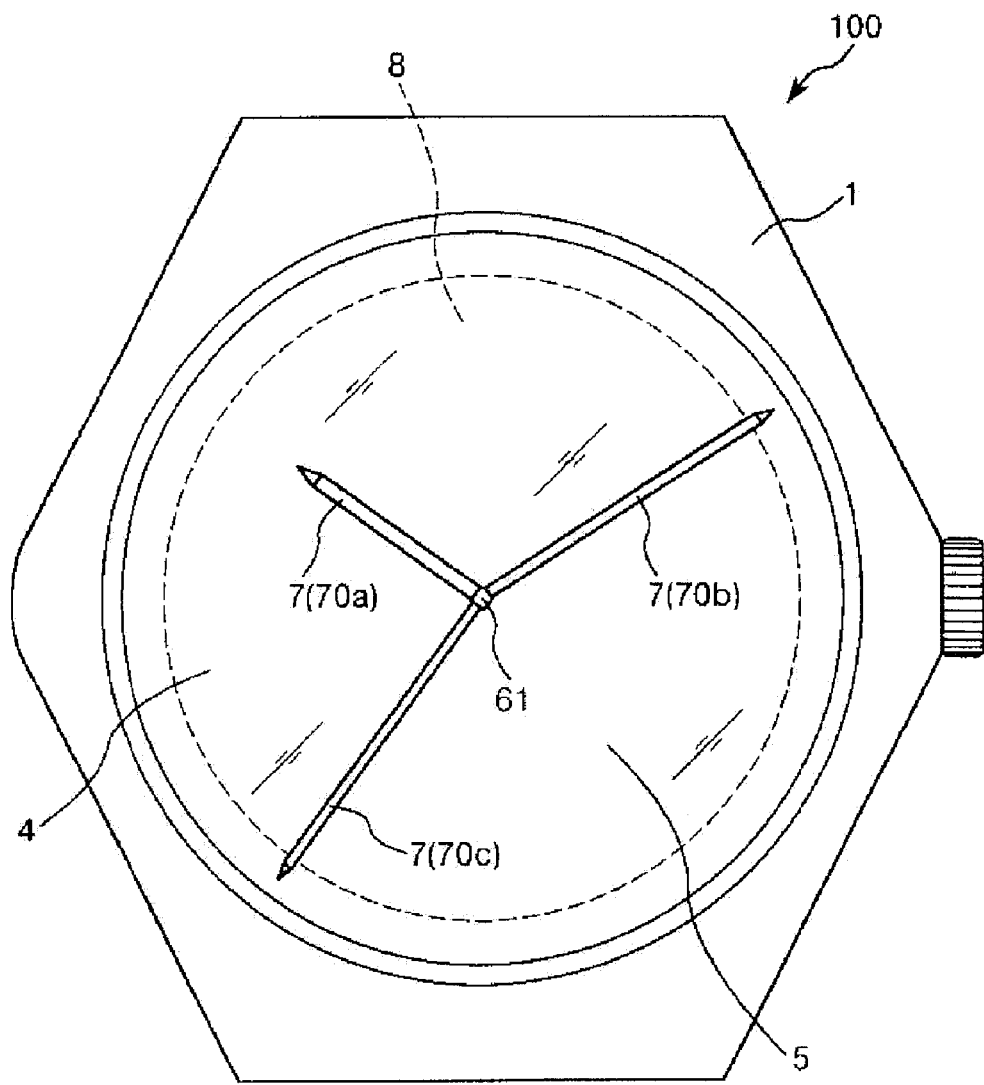
FIG. 2 is a planar diagram illustrating the first embodiment of the timepiece of the invention.
Figure 3:
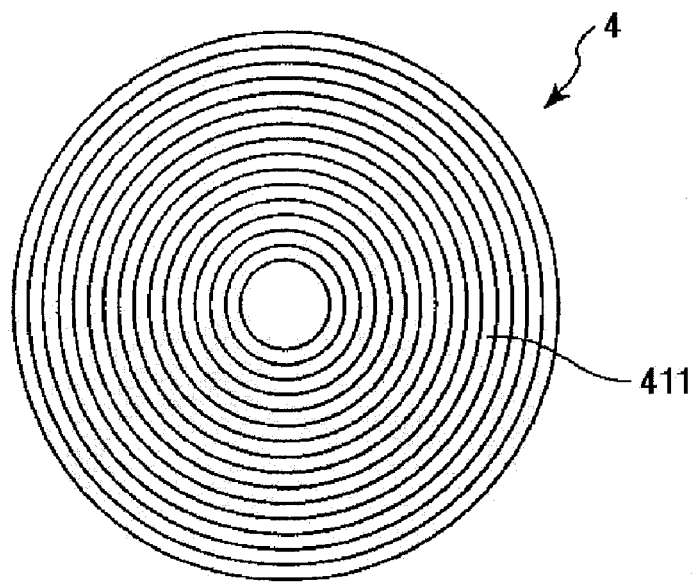
FIG. 3 is a planar diagram illustrating an example of a dial plate which is provided in the timepiece of the invention.
Figure 4:
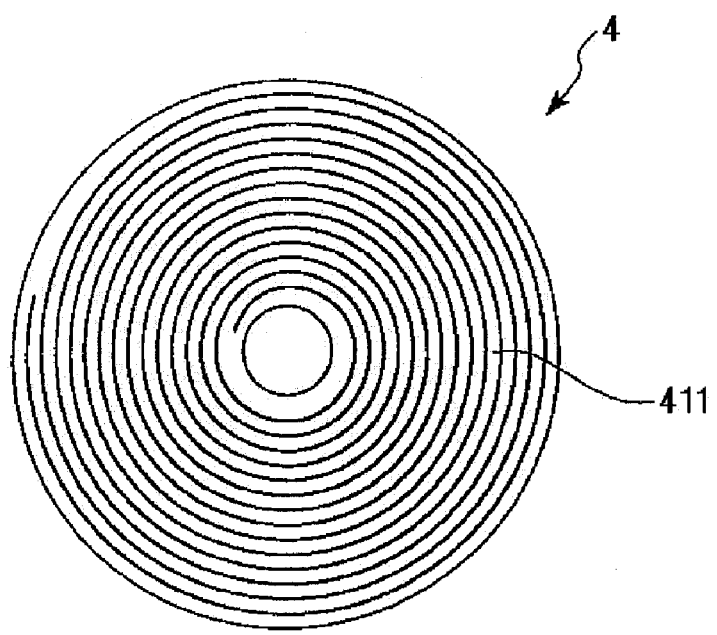
FIG. 4 is a planar diagram illustrating another example of a dial plate which is provided in the timepiece of the invention.

FIG. 1 is a partial cross sectional diagram illustrating the first embodiment of the timepiece of the invention, FIG. 2 is a planar diagram illustrating the first embodiment of the timepiece of the invention, FIG. 3 is a planar diagram illustrating an example of a dial plate which is provided in the timepiece of the invention, and FIG. 4 is a planar diagram illustrating another example of a dial plate which is provided in the timepiece of the invention. Here, for ease of understanding, the diagrams referred to in the present specifications are illustrated to emphasize sections of the configuration, and do not accurately illustrate the actual dimensions or the like.

As shown in FIG. 1, a timepiece (wristwatch) 100 is provided with a body (case) 1, a back cover 3, and a glass plate (cover glass) 5. In addition, in a space inside the case (a space which is formed by the body, the back cover 3, and the glass plate 5), a dial plate 4, a solar battery 8, a movement 9, and an inner frame 2 which has a function of holding the dial plate 4, the solar battery 8, and the movement 9 are accommodated in order from the side where the glass plate 5 is provided.

The body (case) 1 can be configured by any material, but from the viewpoint of achieving both excellent appearance and durability, it is preferably configured by a metal material, a ceramic material, or the like.

The glass plate 5 is normally configured by transparent glass, sapphire or the like with high transparency. Due to this, it is possible for the visibility of the time and the like to be excellent and it is possible for light to be incident in a sufficient amount onto the solar battery 8.

The inner frame 2 has a function of holding the dial plate 4, the solar battery 8, and the movement 9. By providing such an inner frame, the relative movement of the dial plate 4, the solar battery 8, and the movement 9 in the body (case) 1 is regulated. The inner frame 2 can be configured by any material, but it is preferably configured by a plastic material since plastic material has appropriate elasticity, processing is easy, and the like.

The inner frame 2 has a first portion 21 which holds the dial plate 4, a second portion 22 which holds the solar battery 8, and a third portion 23 which holds the movement 9. Then, a step is provided between the first portion 21 and the second portion 22. Due to this, it is possible to appropriately hold both the dial plate 4 and the solar battery 8 which has an area smaller than the dial plate 4 when seen in a planar view. In addition, the occurrence of collisions between the dial plate 4 and the solar battery 8 and damage or defects in these members inside the case 1 are more reliably prevented.

The solar battery 8 has a function where generation of power is performed using light which is incident through the dial plate 4 or the like, that is, a function where light energy is converted to electrical energy. The electrical power which is generated by the solar battery 8 charges a rechargeable battery which is provided on a circuit board through a conductive member, and the movement 9 and the like are driven using the output from the rechargeable battery.

The solar battery 8 has, for example, a pin structure where p-type impurities and n-type impurities are selectively introduced into non-single-crystal silicon thin films and an i-type non-single-crystal silicon thin film which has a low impurity density is further provided between the p-type non-single-crystal silicon thin film and the n-type non-single-crystal silicon thin film.

The solar battery 8 is held by the second portion 22 of the inner frame 2. Due to this, the movement of the solar battery 8 inside the case 1 is regulated.

A shaft 61 is provided in the movement 9 and an hour hand 70a, a minute hand 70b, and a second hand 70c as hands 7 are supported by the shaft 61 to be able to rotate.

The movement 9 has a built-in mechanism which drives (rotates) the hands 7 using the electrical power which is generated by the power generation of the solar battery 8.

Although omitted in FIG. 1, inside the movement 9, for example, there is provided an electric double layer capacitor which stores the electromotive force of the solar battery 8, a lithium ion rechargeable battery, a crystal oscillator as a time reference source, a semiconductor integrated circuit which generates a driving pulse which drives the timepiece on the basis of the oscillation frequency of the crystal oscillator, a step motor which drives the hand every second using a wheel train mechanism, a wheel train mechanism which transmits the movement of the step motor to the hands, or the like.

The dial plate 4 has functions such as increasing the visibility and discriminability of the time or the like using a member arranged at the rear surface side of the hands 7. In addition, the dial plate 4 is also a member which has a considerable effect on the aesthetics (aesthetic appearance) of the timepiece 100 as a whole. In particular, in the invention, the dial plate has a function of preventing the solar battery from being directly visible to an observer (the user or the like) of the timepiece.

In addition, the dial plate 4 has a larger area (area when seen in a planar view) than the solar battery 8 and encompasses the solar battery 8 in a planar view. Due to this, it is possible to more reliably prevent the solar battery 8 from being visible to the observer of the timepiece 100 while setting a proportion of the outside of the timepiece 100 which is occupied by the dial plate 4 to be sufficiently large.

Here, in solar timepieces (timepieces which are provided with a solar battery) in the related art, there have been cases where it is not possible to secure a sufficient amount of power generation despite being used in a comparatively bright environment.

With the advantage of solving such a problem, the invention was reached as a result of the inventors performing intensive research with a focus on a relationship between the brightness of the environment in which the timepiece is used and the strength of the light which is irradiated to the solar battery. In other words, in solar timepieces in the related art, in a case where light is incident with regard to the dial plate from the normal line direction, it is possible to efficiently perform the power generation in the solar battery, but the present inventors discovered that, as the angle which is formed with the normal line of the dial plate and the incidence direction of the light becomes larger (the angle which is formed by the surface of the dial plate and the incidence direction of the light becomes smaller), the power generation efficiency in the solar battery rapidly decreases. Then, in the timepiece of the invention, there is a configuration where the dial plate is provided with grooves or ridges, the grooves or ridges have portions where inclination angles with regard to a normal line of the dial plate are different, and due to this, light which is transmitted through the dial plate is incident from a plurality of directions with angles which are different with regard to the solar battery. Due to this, without being limited to a case where light is incident with regard to the dial plate from the normal line direction, sufficiently excellent power generation efficiency in the solar battery is possible even in a case where the angle which is formed by the normal line of the dial plate and the incidence direction of the light is large (a case where the angle which is formed by the surface of the dial plate and the incidence direction of the light is small). Accordingly, it is possible to suppress unevenness in the power generation amount according to the relationship between the orientation of the dial plate and the incidence direction of external light, and it is possible to secure a stable power generation amount in an environment which has a predetermined brightness or greater. In addition, it is possible to secure a sufficient power generation amount without forcing the user of the watch to use an unnatural posture. In addition, since it is possible to reliably prevent the shape and the like of the solar battery from being visible to the observer by providing the grooves or ridges, a reliably excellent aesthetic appearance (aesthetics) of the timepiece as a whole is possible.

In the timepiece 100 of the present embodiment, grooves 411 are provided in the dial plate 4. Then, the grooves 411 are configured such that an inclination angle is different for each portion, and due to this, light which is transmitted through the dial plate 4 is incident from a plurality of directions with different angles with regard to the solar battery 8. Due to this, an excellent effect as described above is obtained.

Here, in the invention, the "inclination angle" in relation to a groove refers to the angle which is formed by the normal line of the dial plate and the surface where the groove is configured.

In addition, as described above, with regard to the grooves 411, it is sufficient if the inclination angles of each of the portions are different, for example, it is sufficient if there are portions where the inclination angles are different to each other in one of the grooves 411. In addition, in a case where the dial plate 4 has a plurality of grooves 411, the inclination angles in each of the grooves 411 can be constant and the inclination angles can be different between the plurality of grooves 411.

The dial plate 4 can be configured by any material, but the dial plate 4 which is configured by a material which includes a plastic material is appropriately used. Due to this, it is possible for the dial plate 4 as a whole to easily have excellent light transmittance and it is possible to more effectively perform the power generation of the solar battery 8. In addition, particularly excellent productivity of the dial plate 4 is possible and it is possible to more reliably increase the dimensional precision of the grooves 411.

In the configuration of the diagram, the dial plate 4 is provided with a substrate 41 which is provided with the grooves 411 and a color film 42. Due to this, a particularly excellent aesthetic appearance (for example, the stereoscopic effect or the like of the dial plate) of the timepiece 100 is possible.

In addition, appropriate application to production of a wide variety of the timepieces 100 is possible by changing the configuration (for example, the hue, the pattern, and the like) of the color film 42 while keeping the configuration of the substrate 41 in common.

In addition, in the related art, in cases where the color density of the dial plate is set to be comparatively high, there have been problems in that the amount of power generation of the solar battery is rapidly decreased, and in particular, these problems have been remarkable in cases where the angle which is formed by the normal line of the dial plate and the incidence direction of light is large, but in the invention, it is possible to reliably prevent the occurrence of the problems described above even in a case where the color density (color density of the color film) of the dial plate is set to be comparatively high.

For example, the color film 42 can be configured by a material which includes coloring agents such as various types of pigments and various types of dyes, or can be configured by a metal material (for example, a metal thin film).

In addition, the substrate 41 can include other components such as, for example, coloring agents in addition to a resin material.

In the present embodiment, the dial plate 4 (the substrate 41) has the grooves 411 on the surface of the opposite side to the surface of the side which opposes the solar battery 8. Due to this, a particularly excellent aesthetic appearance (for example, the stereoscopic effect or the like of the dial plate 4) of the timepiece 100 is possible while the utilization efficiency of light is sufficiently excellent.

In addition, in this present embodiment, the dial plate 4 (the substrate 41) has grooves, where a cross sectional shape in a direction which is orthogonal to a longitudinal direction is a curved portion 4111, as the grooves 411. Due to this, a particularly excellent aesthetic appearance of the timepiece 100 is possible while the utilization efficiency of light is sufficiently excellent.

In addition, the grooves 411 which configure the dial plate 4 (the substrate 41) preferably have the following relationship in the cross section which is orthogonal to the longitudinal direction thereof. That is, in the cross section which is orthogonal to the longitudinal direction of the grooves 411, a concave portion which corresponds to the grooves 411 is preferably configured by at least a first line 4113 and a second line 4114 which is provided more to the outer peripheral side of the dial plate 4 than the first line 4113, where the first line 4113 is substantially parallel to the normal line of the dial plate 4 and an angle which is formed with the normal line of the dial plate 4 is larger for the second line 4114 than for the first line 4113. Due to this, a particularly excellent aesthetic appearance of the timepiece 100 is possible while the utilization efficiency of light is sufficiently excellent.

In addition, in the configuration of the diagram, an angle θ, which is formed by the curved portion 4111 in the cross section in the direction which is orthogonal to the longitudinal direction of the grooves 411 and the normal line of the dial plate 4, is configured to become smaller from the center of the dial plate 4 toward the outer peripheral side. Due to this, a particularly excellent stereoscopic effect of the dial plate 4 is possible and a particularly excellent aesthetic appearance of the timepiece 100 as a whole is possible.

In particular, as in the present embodiment, the dial plate 4 (the substrate 41) has the grooves 411 on the surface of the opposite side to the surface of the side which opposes the solar battery 8, and when the angle θ, which is formed by the curved portion in the cross section in the direction which is orthogonal to the longitudinal direction of the grooves 411 and the normal line of the dial plate 4, is configured so as to become smaller from the center of the dial plate 4 toward the outer peripheral side, a bowl shaped stereoscopic effect is obtained where the dial plate 4 is depressed in the vicinity of the center and rises up toward the outer peripheral side.

In the configuration illustrated in FIG. 3, the dial plate 4 (the substrate 41) has a plurality of grooves 411 and the grooves 411 are provided concentrically (in particular, in the form of concentric circles in the configuration of the diagram). Due to this, a particularly excellent aesthetic appearance of the timepiece 100 is possible while the utilization efficiency of light is sufficiently excellent.

In addition, in the configuration illustrated in FIG. 4, the dial plate 4 (the substrate 41) has grooves which are provided in a spiral shape as the grooves 411. Due to this, by processing using an NC engraving machine or the like, it is possible to easily and reliably manufacture the dial plate 4 which has the grooves 411 with a desired shape.

The depth of the grooves 411 is not particularly limited, but is preferably 10 μm or more and 100 μm or less and more preferably 10 μm or more and 50 μm or less. Due to this, a particularly excellent aesthetic appearance of the timepiece 100 and efficient utilization of light are possible.

In addition, the pitch of the grooves 411 (the pitch between concave portions which are adjacent in the cross section in the direction which is orthogonal to the longitudinal direction of the grooves 411) is not particularly limited, but is preferably 10 μm or more and 100 μm or less and more preferably 25 μm or more and 50 μm or less. Due to this, a particularly excellent aesthetic appearance of the timepiece 100 and efficient utilization of light are possible.

Second Embodiment

Figure 5:
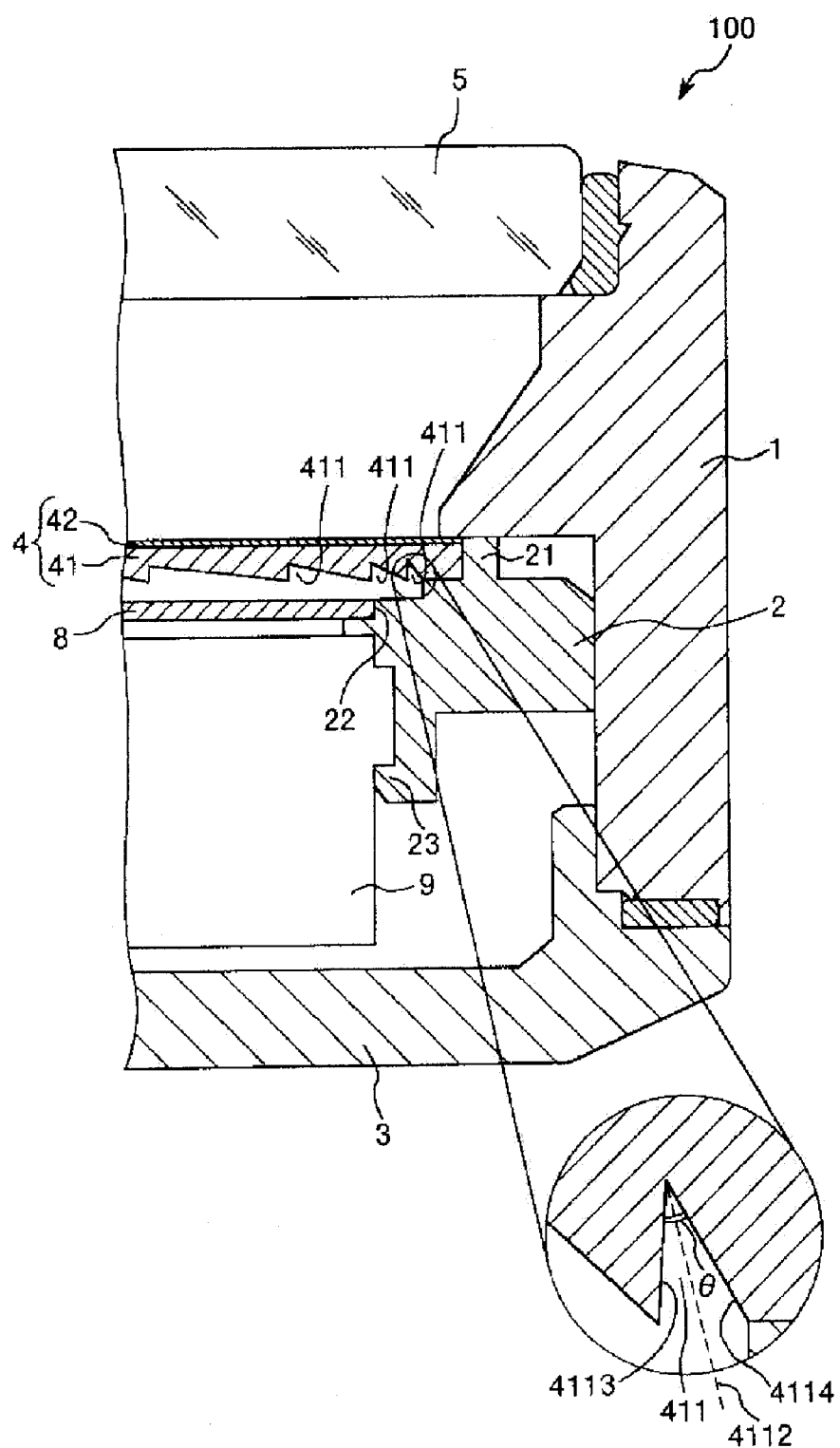
FIG. 5 is a partial cross sectional diagram illustrating a second embodiment of the timepiece of the invention.

Next, the second embodiment of the timepiece of the invention will be described. FIG. 5 is a partial cross sectional diagram illustrating the second embodiment of a timepiece of the invention. Below, the timepiece of the second embodiment will be described by focusing on the points of difference with the embodiment described above and description of points of similarity will be omitted.

As illustrated in FIG. 5, in the timepiece 100 of the present embodiment, the dial plate 4 (the substrate 41) has the grooves 411 on the surface of the side which opposes the solar battery 8. Due to this, it is possible to more appropriately arrange the indicating members such as the time characters on the dial plate 4, and particularly excellent durability (adhesion of the indicating members) or the like of the timepiece 100 is possible.

In addition, in the present embodiment, the dial plate 4 (the substrate 41) has grooves, where a cross sectional shape in a direction which is orthogonal to a longitudinal direction is a V shape, as the grooves 411. Due to this, by processing using an NC engraving machine or the like, it is possible to easily and reliably manufacture the dial plate 4 (the substrate 41) which has the grooves 411 with a desired shape.

In addition, in the configuration of the diagram, an angle θ, which is formed by a bisecting line 4112 of the V shape in the cross section in the direction which is orthogonal to the longitudinal direction of the grooves 411 and the normal line of the dial plate 4, is configured to become smaller from the center of the dial plate 4 toward the outer peripheral side. Due to this, a particularly excellent stereoscopic effect of the dial plate 4 is possible and a particularly excellent aesthetic appearance of the timepiece 100 as a whole is possible.

In particular, as in the present embodiment, the dial plate 4 (the substrate 41) has the grooves 411 on the surface of the side which opposes the solar battery 8, and when the angle θ, which is formed with the bisecting line 4112 of the V shape in the cross section in the direction which is orthogonal to the longitudinal direction of the grooves 411 is configured so as to become smaller from the center of the dial plate 4 toward the outer peripheral side, a dome shaped stereoscopic effect is obtained in which the dial plate 4 rises up in the vicinity of the center while being depressed toward the outer peripheral side thereof.

Above, appropriate embodiments of the invention have been described, but the invention is not limited to the above description.

For example, in the timepiece of the invention, it is possible for the configuration of each of the sections to be replaced with an arbitrary configuration which exhibits the same function, and in addition, it is possible to add any arbitrary configuration.

In addition, in the embodiment described above, the dial plate has been described as having grooves, but the dial plate in the invention can have ridges instead of the grooves or in addition to the grooves. Here, since the grooves and the ridges have a relative relationship, it is possible to interpret a region between a groove and a groove as a ridge and, in addition, it is possible to interpret a region between a ridge and a ridge as a groove.

In addition, in the embodiment described above, the color film has been described as provided on the surface of the opposite side to the surface where the grooves are provided in the substrate, but the color film can be provided on the surface of the side where the grooves are provided in the substrate, or can be provided on both sides of the substrate. In addition, in the timepiece of the invention, it is not necessary to provide a color film in the dial plate.

In addition, in the embodiment described above, the dial plate (the substrate) has been described representatively in a case where the grooves are provided only on one surface, but in the timepiece of the invention, grooves or ridges can be provided on both surfaces of the dial plate (the substrate).

In addition, in the first embodiment described above, a case has been described with a configuration where the dial plate (the substrate) has grooves on the surface of the opposite side to the surface of the side which opposes the solar battery, the dial plate (the substrate) has grooves, where a cross sectional shape in a direction which is orthogonal to a longitudinal direction is a curved portion, as the grooves, and the angle θ, which is formed by the curved portion in the cross section in the direction which is orthogonal to the longitudinal direction of the grooves and the normal line of the dial plate, becomes smaller from the center of the dial plate to the outer peripheral side, but a bowl shaped stereoscopic effect is obtained in which the dial plate is depressed in the vicinity of the center thereof and rises up toward the outer peripheral side in the same manner as the first embodiment described above even in the case of a configuration where the dial plate (the substrate) has grooves on the surface of the opposite side to the surface of the side which opposes the solar battery, the dial plate (the substrate) has grooves, where a cross sectional shape in a direction which is orthogonal to a longitudinal direction is a V shape, as the grooves, and the angle θ, which is formed with the bisecting line of the V shape in the cross section in the direction which is orthogonal to the longitudinal direction of the grooves, becomes smaller from the center of the dial plate to the outer peripheral side.

In addition, in the second embodiment described above, a case has been described with a configuration where the dial plate (the substrate) has grooves on the surface of the side which opposes the solar battery, the dial plate (the substrate) has grooves, where a cross sectional shape in a direction which is orthogonal to a longitudinal direction is a V shape, as the grooves, and the angle θ, which is formed with the bisecting line of the V shape in the cross section in the direction which is orthogonal to the longitudinal direction of the grooves, becomes smaller from the center of the dial plate to the outer peripheral side, but a dome shaped stereoscopic effect is obtained in which the dial plate rises up in the vicinity of the center thereof and is depressed toward the outer peripheral side in a similar manner to the second embodiment described above, even in the case of a configuration where the dial plate (the substrate) has grooves on the surface of the side which opposes the solar battery, the dial plate (the substrate) has grooves, where a cross sectional shape in a direction which is orthogonal to a longitudinal direction is a curved portion, as the grooves, and the angle θ, which is formed by the curved portion in the cross section in the direction which is orthogonal to the longitudinal direction of the grooves and the normal line of the dial plate, becomes smaller from the center of the dial plate to the outer peripheral side.

What is claimed is:

1. A timepiece comprising:
a dial plate having a front surface and a rear surface; and
a solar battery disposed on a rear side of the timepiece with respect to the rear surface of the dial plate such that the front surface of the dial plate faces away from the solar battery,
wherein the dial plate has grooves or ridges on the rear surface of the dial plate, and
the grooves or the ridges have portions where inclination angles with regard to a normal line of the dial plate are different such that light transmitted through the grooves or the ridges of the dial plate is incident on the solar battery from a plurality of directions with angles which are different from each other and wherein each of the grooves are defined between a radially inside surface and a radially outside surface, an inclination angle of each of the radially inside surfaces with respect to the normal line of the dial plate being smaller than an inclination angle of respective one of the radially outside surfaces with respect to the normal line of the dial plate.

2. The timepiece according to claim 1,
wherein the dial plate has grooves or ridges which are provided concentrically as the grooves or the ridges.
3. The timepiece according to claim 1,
wherein the dial plate has grooves or ridges which are provided in a spiral shape as the grooves or the ridges.
4. The timepiece according to claim 1,
wherein the dial plate has grooves or ridges, where a cross sectional shape in a direction which is orthogonal to a longitudinal direction is a curved portion, as the grooves or the ridges.
5. The timepiece according to claim 1,
wherein the dial plate has grooves or ridges, where a cross sectional shape in a direction which is orthogonal to a longitudinal direction is a V shape, as the grooves or the ridges.
6. The timepiece according to claim 1,
wherein the dial plate is provided with a substrate where the grooves or the ridges are provided and a color film.
7. The timepiece according to claim 1,
wherein each of the grooves are defined between a radially inside surface and a radially outside surface, inclination angles of the radially outside surfaces with respect to the normal line of the dial plate decreasing as moving radially outwardly from a center of the dial plate, inclination angles of the radially inside surfaces with respect to the normal line of the dial plate being the same with respect to each other.

* * * * *